United States Patent [19]
Ramakrishnan

[11] Patent Number: 5,900,762
[45] Date of Patent: May 4, 1999

[54] SELF-CALIBRATING ELECTRONIC PROGRAMMABLE DELAY LINE UTILIZING AN INTERPOLATION ALGORITHM

[75] Inventor: Vinodkumar Ramakrishnan, Mountain View, Calif.

[73] Assignee: Hewlett-Packard Company, Palo Alto, Calif.

[21] Appl. No.: 08/906,545

[22] Filed: Aug. 5, 1997

[51] Int. Cl.[6] .................................................. H03H 11/26
[52] U.S. Cl. ......................... 327/277; 327/155; 327/160; 327/161; 327/279; 327/281
[58] Field of Search .................................... 327/155, 160, 327/161, 277, 279, 281, 299

[56] References Cited

U.S. PATENT DOCUMENTS

| | | | |
|---|---|---|---|
| 5,465,076 | 11/1995 | Yamauchi et al. | 331/179 |
| 5,789,969 | 8/1998 | Davis et al. | 327/279 |
| 5,801,562 | 9/1998 | Fuji | 327/161 |

*Primary Examiner*—Margaret R. Wambach
*Attorney, Agent, or Firm*—Brian R. Short

[57] ABSTRACT

A programmable delay line. The programmable delay line includes a series of delay cells which are programmably connected in series. The programmable delay line includes a main delay chain and auxiliary delay chains. The main delay chain includes unit delay cells. The auxiliary delay chains include a unit delay cell, and a delay cell which has a delay that is between one and two time greater than the delay through a unit delay cell. The delay resolution of the programmable delay line is less than the delay of a unit delay cell. The programmable delay line further includes a reference oscillator and calibration circuitry. The reference oscillator includes a series of unit delay cells, and generates a reference signal having a period which is an integer multiple of the delay of a unit delay cell. Variations in the delay of a unit delay cell influence the period of the reference signal. The reference signal is used to programmably correct the variations in the delay of the programmable delay line due to variations in the delay of a unit delay cell.

8 Claims, 7 Drawing Sheets

| Setting | 1 | 2 | 3 | 4 |
|---|---|---|---|---|
| Delay due to the Main Chain | n*T | n*T | n*T | n*T |
| Delay due to auxiliary Chain 1 | 2*T | 1*T | 1*T | 1*T |
| Delay due to auxiliary Chain 2 | 1*T | 2.25*T | 1*T | 1*T |
| Delay due to auxiliary Chain 3 | 1*T | 1*T | 2.5*T | 1*T |
| Delay due to auxiliary Chain 4 | 1*T | 1*T | 1*T | 2.75*T |
| Total Delay of the Main Auxiliary and delay Chains | (n+5)*T | (n+5.25)*T | (n+5.5)*T | (n+5.75)*T |

Figure 3

SELF-CALIBRATING ELECTRONIC PROGRAMMABLE DELAY LINE UTILIZING AN INTERPOLATION ALGORITHM

FIELD OF INVENTION

This invention relates generally to a programmable delay line. In particular, it relates to a programmable delay line which connects delay cells in series and the delay resolution of the programmable delay line is a fraction of the delay of a single delay cell.

BACKGROUND

Programmable delay lines are required for the generation of accurately shaped waveforms, and for delaying electronic signals. These waveforms are used in automated test systems (ATEs), to measure time intervals and to sample data at circuit interfaces. Specific applications require varying degrees of accuracy and resolution in the delay of the electronic signal.

ATEs can require delay lines with a delay resolution of 10 to 20 picoseconds. Data sampling of circuit interfaces may, for example, only require delay lines with delay resolutions of 100 to 200 picoseconds for systems operating at 100 MHZ. Strobe signals in high speed interfaces require delay lines in which the delay remains constant even though the delay line may be fabricated using varying processes and the delay line is subjected to varying temperatures and supply voltages.

Programmable delay lines have been designed using random access memory (RAM), coupled oscillators, shift registers, charge coupled devices (CCDs), ramp comparators, multiplexed delay lines and tapped delay lines. Each of these types of delay line designs suffer limitations. These limitation include the resolution of the delay of the delay line being too coarse, or the delay of the delay line being inconsistent. Delay inconsistencies can be due to variations in the process used to fabrication the delay line, or variations in the delay of the delay line due to variations in the temperature or voltage supply of the delay line.

Delay line inconsistencies can also occur due to the design of the delay line being in-tolerant to modeling errors that occur when designing the delay line. That is, when a delay line is being designed, the delay line is modeled. All delay line models include inaccuracies of one type or another. The inaccuracies in the models can cause the delay of the designed delay line to be inconsistent or unpredictable.

It is desirable to have a programmable delay line which offers high resolution. Furthermore, the delay of the programmable delay line should not vary depending on the process used to fabricate the delay line, or because the temperature or supply voltage of the delay line is variable. The programmable delay line should offer consistent performance even if the models used to design the delay line are inaccurate.

SUMMARY OF THE INVENTION

The present invention includes a programmable delay line. The programmable delay line delays a clock signal by passing the clock signal through unit delay cells. The delay resolution of the programmable delay line is less than the delay of a unit delay cell. The invention further includes calibration circuitry for correcting delay errors due to variations in the process used to fabricate the programmable delay line, and variations in the temperature and supply voltage of the programmable delay line.

A first embodiment of the invention includes a programmable delay line. The programmable delay line includes a main delay line chain. The main delay chain includes a plurality of delay cells. Each delay cell has a unit delay of T. The main delay chain is programmable to connect an integer number of the delay cells in series. The programmable delay chain further includes a plurality of N auxiliary delay chains. Each auxiliary delay chain includes a plurality of delay cells. Each auxiliary delay chain is programmable to connect the delay cells within each auxiliary delay chain in series. A first delay cell within each auxiliary delay chain has a delay of T. A second delay cell within the Xth auxiliary delay chain has a delay of $(1+X/N)*T$, where X varies from 0 to (N-1). The plurality of auxiliary delay chains are connected in series with the main delay chain and receive a clock signal having a period of TCLK. The clock signal is coupled through the main delay chain and the plurality of auxiliary delay chains and the clock signal is programmably delayed with a resolution of $(T)/N$.

Another embodiment of the invention is similar to the first embodiment but further includes a reference oscillator generating a reference signal having a period TREF which is a multiple of T. This embodiment further includes logic circuitry for comparing the period TREF of the reference signal and the period TCLK of the clock signal and programming the main delay chain and the auxiliary delay chain to compensate for deviations in the delay.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 3 is a table which shows the delay of the programmable delay line for the four settings of the auxiliary delay lines of FIG. 2 when the delay of the main delay line is held constant.

DETAILED DESCRIPTION

Figure 1:
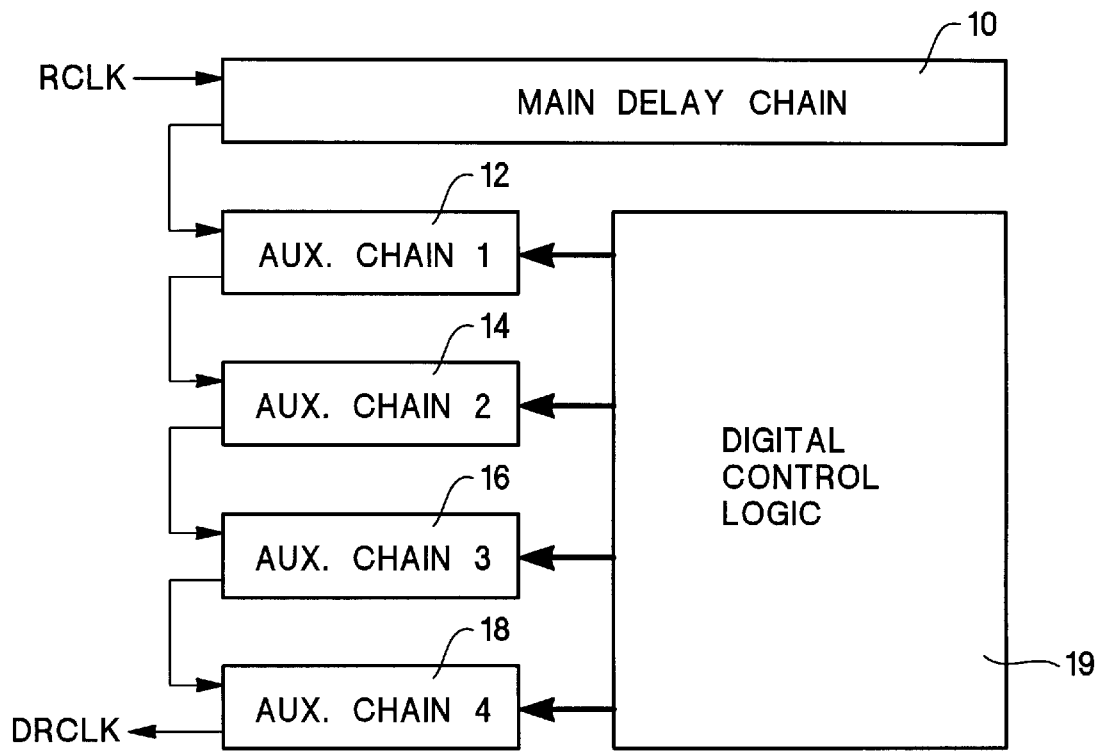
FIG. 1 shows an embodiment of the invention.

As shown in the drawings for purposes of illustration, the invention is embodied in an electronic programmable delay line. The programmable delay line provides delay resolution which is only limited by the technology used to implement the delay line. However, the programmable delay line includes control logic which is technology independent. The programmable further includes calibration logic which compensates for variation in the process, temperature or voltage of the programmable delay line circuitry.

FIG. 1 shows an embodiment of the invention. The programmable delay line of this embodiment includes a main delay chain 10 and auxiliary delay chains 12, 14, 16, 18. The programmable delay chain receives a clock signal RCLK and programmably delays the clock signal RCLK by electrically coupling the clock signal RCLK through the main delay chain 10 and the auxiliary delay chains 12, 14, 16, 18. A digital control logic block 19 controls the delay through the main delay chain 10 and the auxiliary delay chains 12, 14, 16, 18. The output of the programmable delay line is a delayed clock signal DRCLK.

Figure 2:
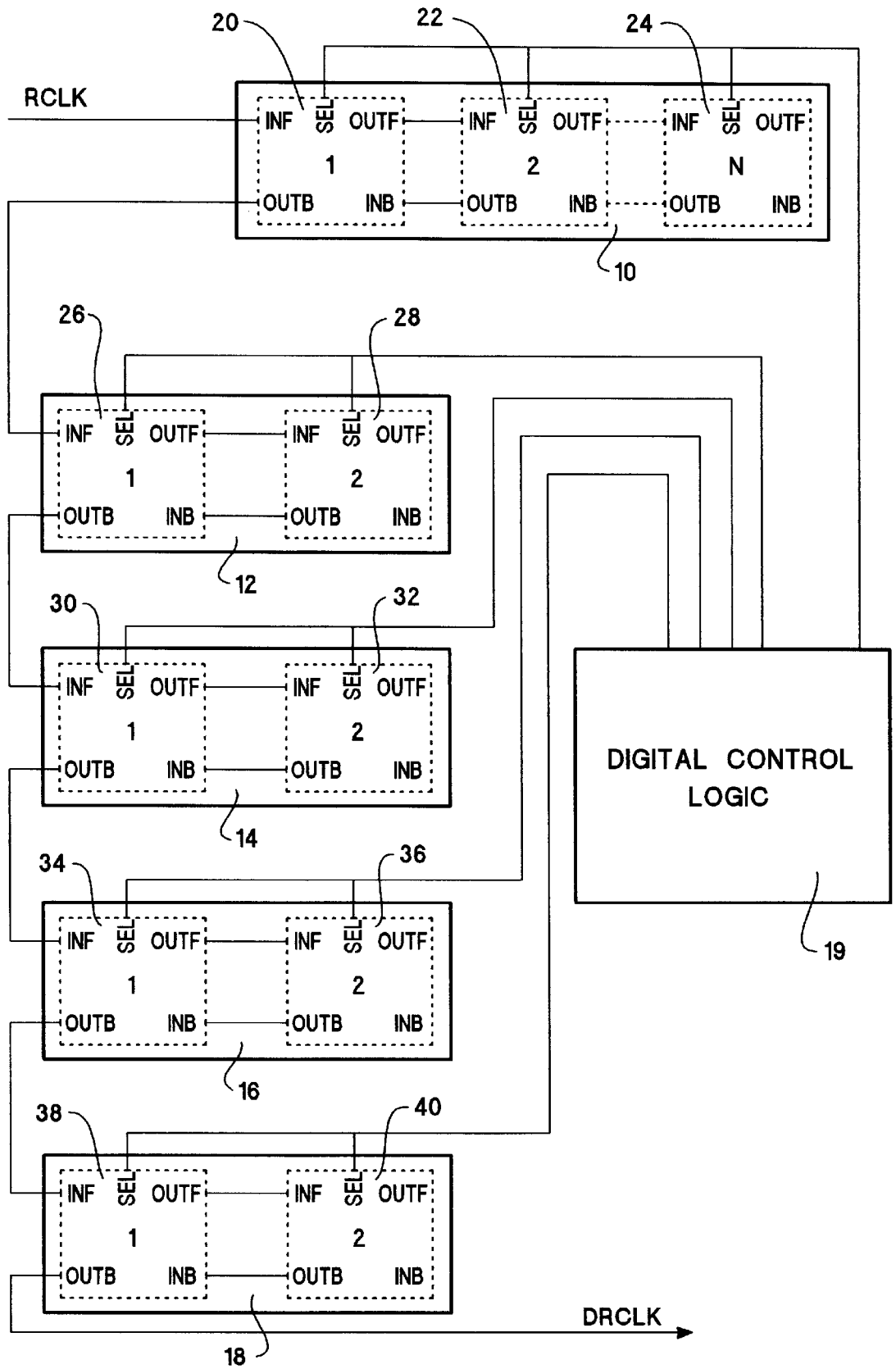
FIG. 2 shows delay cells of the main delay chain and the auxiliary delay chains of FIG. 1.

FIG. 2 shows greater detail of the embodiment shown in FIG. 1. FIG. 2 shows unit delay cells within the main delay chain 10 and delay cells within the auxiliary delay chains 12, 14, 16, 18. The main delay chain 10 includes several unit cell delays 20, 22, 24. The main delay 10 of FIG. 2 only shows three unit delay cells, but more can be included. For the purposes of the discussion here, the delay through a unit delay cell is T.

The first cells 26, 30, 34, 38 of the auxiliary delay chains 12, 14, 16, 18 are unit delay cells like the unit delay cells 20, 22, 24 of the main delay chain 10. However, the second cells 28, 32, 36, 40 are not unit delay cells. Rather, the second cells 28, 32, 36, 40 are designed so that the second cells 28, 32, 36, 40 have a delay which ranges between one and two times the delay of a unit delay cell. For the embodiment shown in FIG. 2, the delay of the second cell 28 of the first auxiliary delay chain 12 is 1 T, the delay of the second cell 32 of the second auxiliary delay chain 14 is 1.25 T, the delay of the second cell 36 of the third auxiliary delay chain 16 is 1.5 T, the delay of the second cell 40 of the fourth auxiliary delay chain 18 is 1.75 T.

The first unit delay cell 20 of the main delay chain 10 and the first unit delay cells 26, 30, 34, 38 of the auxiliary delay chains 12, 14, 16, 18 are always included within the series of delay cells which delay the clock signal RCLK. At any given time, only one of the second cells 28, 32, 36, 40 of the auxiliary delay lines 12, 14, 16, 18 are included within the series of delay cells which delay the clock signal RCLK. Therefore, the minimum delay through the programmable delay line is 6 T.

Each delay cell has a select line SEL. The select line SEL of a delay cell controls whether the output OUTB of the delay cell is connected to the input INF of the delay cell or the input INB of the delay cell. If the select line SEL of the delay cell is active, the output OUTB is connected to the input INF of the delay cell. If the select line SEL of the delay cell is inactive, the output OUTB is connected to the input INB of the delay cell. For example, if the select line SEL of the unit delay cell 20 of the main delay chain 10 is active, then the output OUTB of the unit delay cell 20 is connected to the input INF of the unit delay cell 20. Therefore, the total delay associated with the main delay chain is the delay of the unit delay cell 20. If the select line SEL of the unit delay cell 20 of the main delay chain 10 is inactive and the select line SEL of the unit delay cell 22 of the main delay chain 10 is active, then the output OUTB of the unit delay cell 20 is connected to the input INB of the unit delay cell 20 and the output OUTB of the unit delay cell 22 is connected to the input INF of the unit delay cell 22. Therefore, the total delay associated with the main delay chain is the delay of the unit delay cell 20 and the unit delay cell 22.

The main delay chain 10 can include several unit delay cells. The total delay of the main delay chain 10 is defined by the cumulative delay of the delay cells starting from the unit delay cell 20 and ending at the first of the unit delay cells 22, 24 which has a select line SEL that is active.

The auxiliary delay chains 12, 14, 16, 18 operate in a similar manner as the main delay chain. That is, the delay associated with each delay chain is defined by the delay cell of each delay chain closest to the input of the delay chain to have a select line SEL which is active. Only one of the first cells 26, 30, 34, 38 of the auxiliary delay chains 12, 14, 16, 18 28, 32, may have a select line SEL which is in-active at any point in time.

The digital control logic block 19 controls the selection of which delay cells are included among the series of delay cells which define the delay of the clock signal RCLK. That is, the digital control logic block 19 controls which of the delay cells have a select line SEL which is active.

For each programmed delay configuration through the main delay chain 10, there are four settings of the auxiliary delay chains. The four settings correspond to the second delay cell 28, 32, 36, 40 of each of the auxiliary delay lines 12, 14, 16, 18 being active. FIG. 3 is a table which shows the delay of the programmable delay line for the four settings of the auxiliary delay lines 12, 14, 16, 18 when the delay of the main delay line 10 is held constant. The delay of a unit delay cell is designated as T. The delay through the main delay chain is n*T for each of the four setting, corresponding to the clock signal RCLK passing through n unit delay cells in the main delay chain. The first setting corresponds to the second delay cell 28 of the first auxiliary delay chain 12 being active. The second setting corresponds to the second delay cell 32 of the second auxiliary delay chain 14 being active. The third setting corresponds to the second delay cell 36 of the third auxiliary delay chain 16 being active. The fourth setting corresponds to the second delay cell 40 of the fourth auxiliary delay chain 18 being active.

The auxiliary delay chains are used to achieve a delay step resolution that is a sub-multiple of the propagation delay of a single delay cell through interpolation. As shown in the table of FIG. 3, the resolution of the cumulative delay through the programmable delay chain is 0.25 T. That is, the incremental change in the total delay for each of the four settings is 0.25 T. The net result being that the programmable delay chain has a delay resolution of less than the delay of a unit delay cell.

FIG. 1 and FIG. 2 only show one embodiment of the invention. The resolution of the programmable delay line can be improved by increasing the number of auxiliary delay chains. For example, if the number of auxiliary delay chains is increased to five, the resolution of the programmable delay line can be decreased to 0.2 T. However, the minimum delay increases from 6 T to 7 T.

Figure 4:
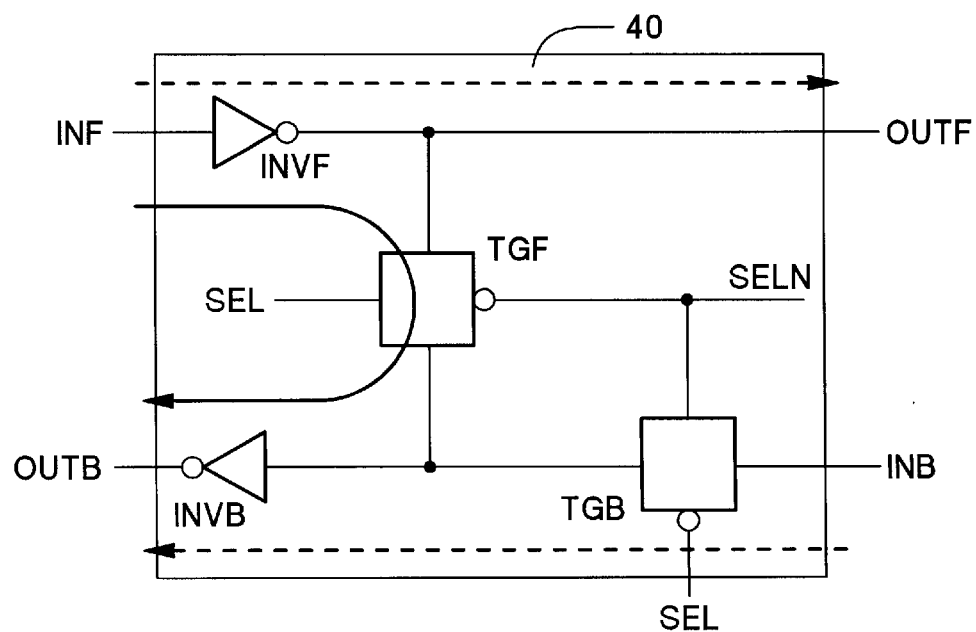
FIG. 4 shows more detail of the features of the delay cell which is included within the main delay chain and the auxiliary delay chains of FIG. 1.

FIG. 4 shows more detail of the features of a delay cell 40. The structure of the delay cell 40 is selected so that the length of the delay chain the delay cell 40 is associated with does not influence the locations of the clock signal entry point INF and exit point OUTB of a delay chain. As previously mentioned, the delay cell 40 can be driven to one of two states by the select line SEL corresponding to the delay cell 40. The electronic devices within the delay cell 40 are dimensioned so that the delay is the same for both states of the delay cell 40. That is, the delay through a delay cell 40 is the same whether the delay cell 40 is selected or not. The input INF is always connected to the output OUTF. The select line controls whether the output OUTB is connected to the input INF or the input INB.

Figure 5:
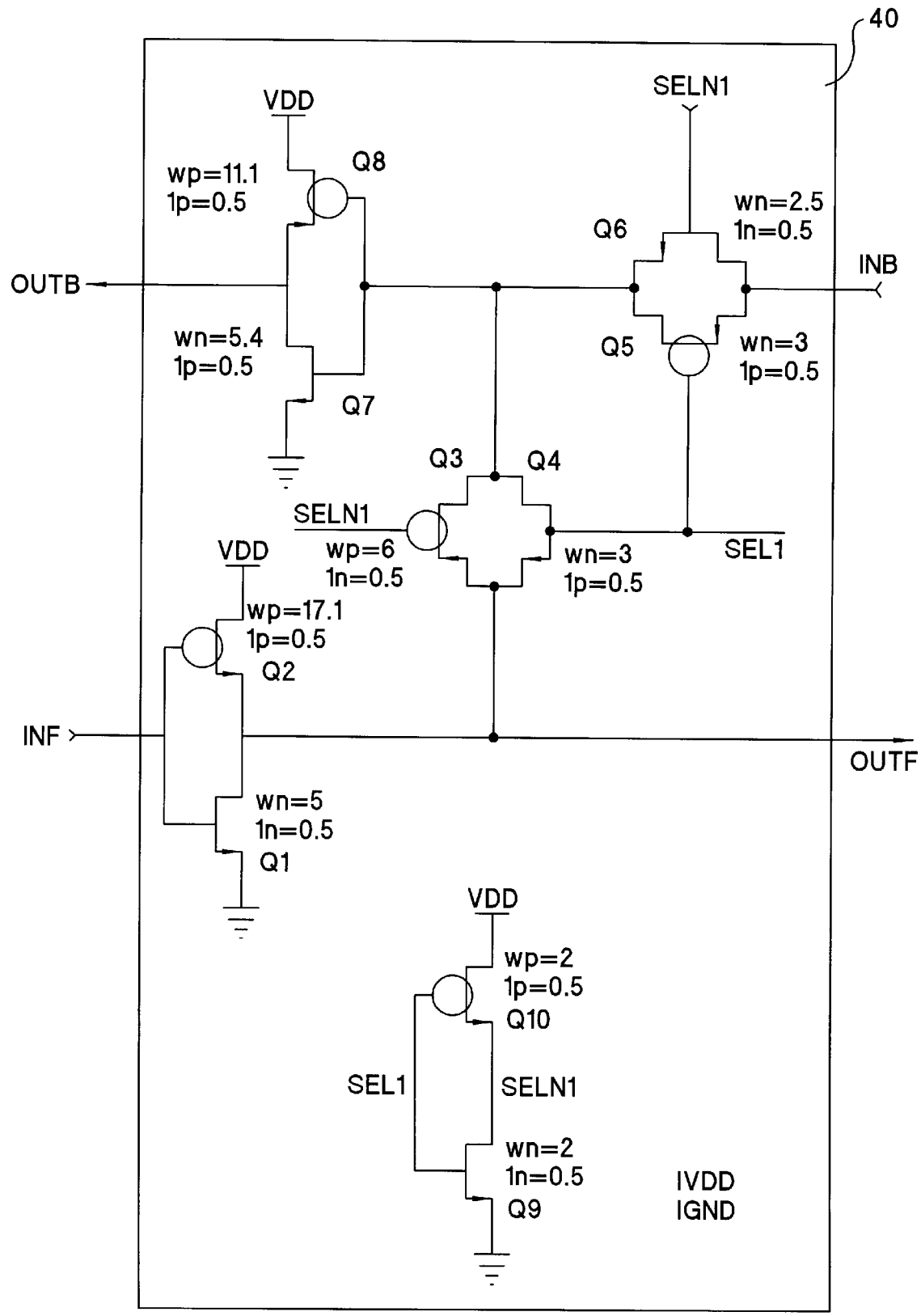
FIG. 5 shows a circuit schematic of the delay cell shown in FIG. 4.

FIG. 5 is a circuit schematic of a delay cell 40. An embodiment of the invention includes the gate lengths of all the transistors Q1, Q2, Q3, Q4, Q5, Q6, Q7, Q8 being fixed at 0.5 microns. The transistors Q9 and Q10 generate a signal SELN which is at an inverted signal level of the select line SEL. The delay through the delay cell is adjusted by varying the gate widths of the transistors Q1–Q8.

The gate width of the transistors Q1 through Q8 are adjusted following an iterative process. The same iterative process is followed whether a unit delay cell is being designed or a delay cell which has a delay which is a ratio between one and two times the delay of a unit delay cell.

The iterative process is performed on several delay cells (typically about ten) connected in series. A clock pulse (typically having a pulse duration of about 8 ns and a duty cycle of 50%) is connected to the INF input of the first delay cell of the series of delay cells. A delay cell, for example, the tenth delay cell of the series of delay cells, is selected by activating the SEL line of the delay cell. The SEL lines connected to all the other delay cells are de-activated. The delay between the INF input and the OUTB output of the first delay cell is measured. The measured delay corresponds to the delay through ten delay cells. Next, the eleventh delay cell of the series of delay cells is selected by activating the SEL line of the eleventh delay cell. The SEL lines connected to all the other delay cells are de-activated. The delay between the INF input and the OUTB output of the first delay cell is re-measured. The re-measured delay corresponds to the delay through eleven delay cells. The difference between the delay of the two measurements yields the delay through a single delay cell, namely, the eleventh delay cell.

To adjust the delay through an individual delay cell, the channel widths of transistors Q1, Q2, Q7, Q8 are adjusted to ensure that the rising edge and falling edge delay through them are equal. Next, the channel widths of transistors Q3, Q4, Q5, Q6 are adjusted to ensure that the rising edge and falling edge delay through them are equal. In some cases, the channel widths of transistors Q1, Q2, Q7, Q8 must be re-adjusted to compensate for dissimilar rising and falling edge delays due to Q3, Q4, Q5, Q6. For the unit delay cells, the delay per unit delay cell is minimized. An embodiment of the invention includes the delay of a unit delay cell being about 400 picoseconds.

The art of adjusting the channel widths of transistors which have fixed channel lengths to obtain a controlled delay of a signal coupled through the transistor is well known. The delay through each cell can be measured following the measurement process previously described. That is, the delay through a particular delay cell can be determined by measuring the delay through a chain of delay cells which both includes and does not include the delay cell in which the delay is being determined. The difference between the two measurements yields the delay through the delay cell in which the delay is being determined.

Figure 6:
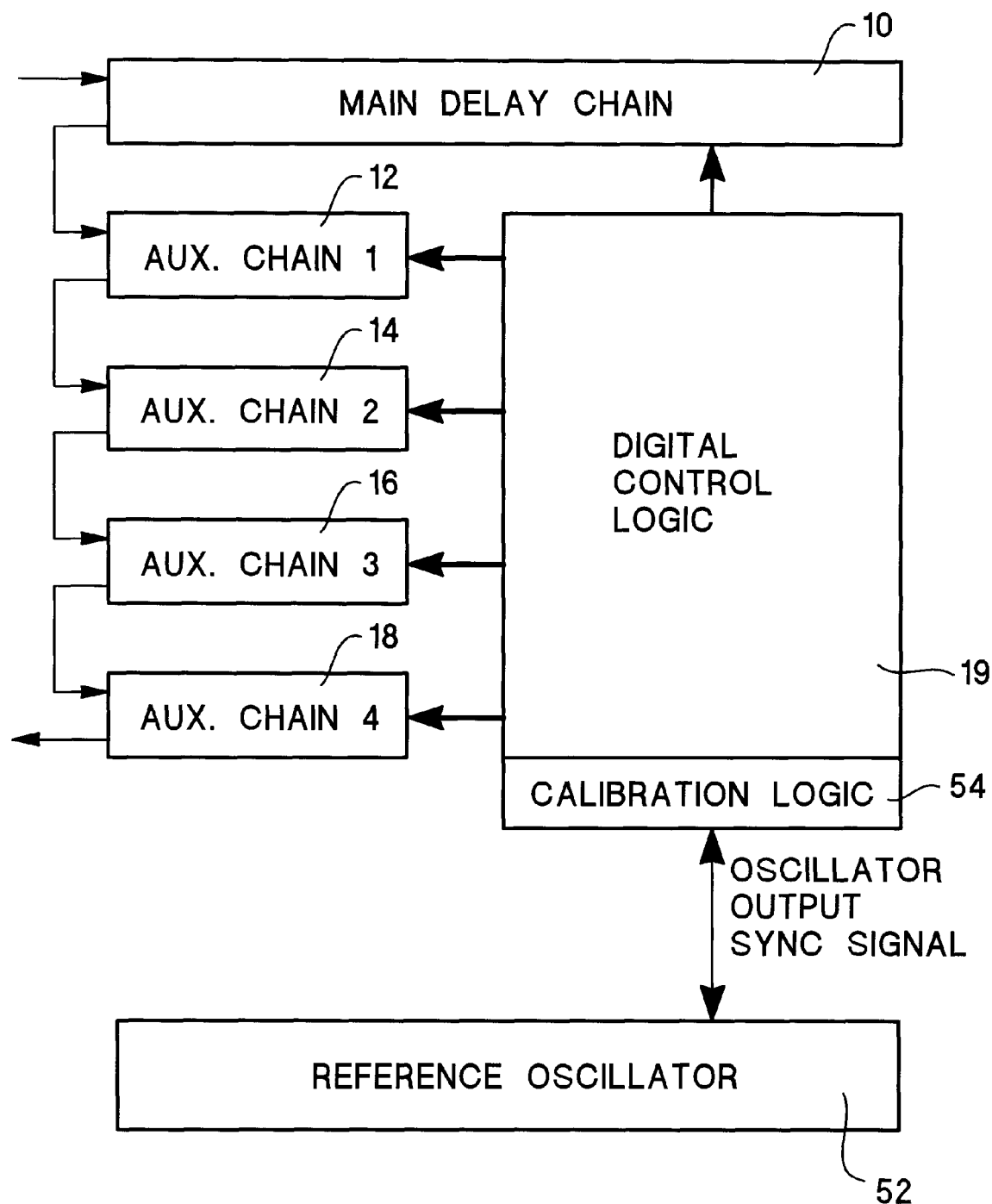
FIG. 6 shows another embodiment of the invention which includes a reference oscillator and calibration logic circuitry.

FIG. 6 shows another embodiment of the invention which includes a reference oscillator 52 and calibration logic circuitry 54. The programmable delay line of this embodiment includes continuous calibration. As described above, the delay T of a unit delay cell will vary with process, temperature and supply voltage. This embodiment compensates for variations in the delay T by adjusting the number of delay cells connected in series to achieve a desired delay.

The reference oscillator 52 generates a signal having a period of TREF. The period TREF is an integer multiple of the delay T. The reference oscillator is constructed from a series of unit delay cells which are identical to the unit delay cells within the main delay chain 10. Therefore, as the delay T varies, the period TREF of the reference oscillator 52 varies proportionately. The calibration logic circuitry continuously compares the period TREF of the reference oscillator 52 with a period TCLK of the clock signal RCLK. If the period TREF increases due to variations in the value of the delay T, the calibration logic circuitry 54 accordingly decrements the number of delay cells within the programmable delay loop that delay the clock signal RCLK. If the period TREF decreases due to variation in the value of the delay T, the calibration logic circuitry 54 accordingly increments the number of delay cells within the programmable delay loop that delay the clock signal RCLK.

Figure 7:
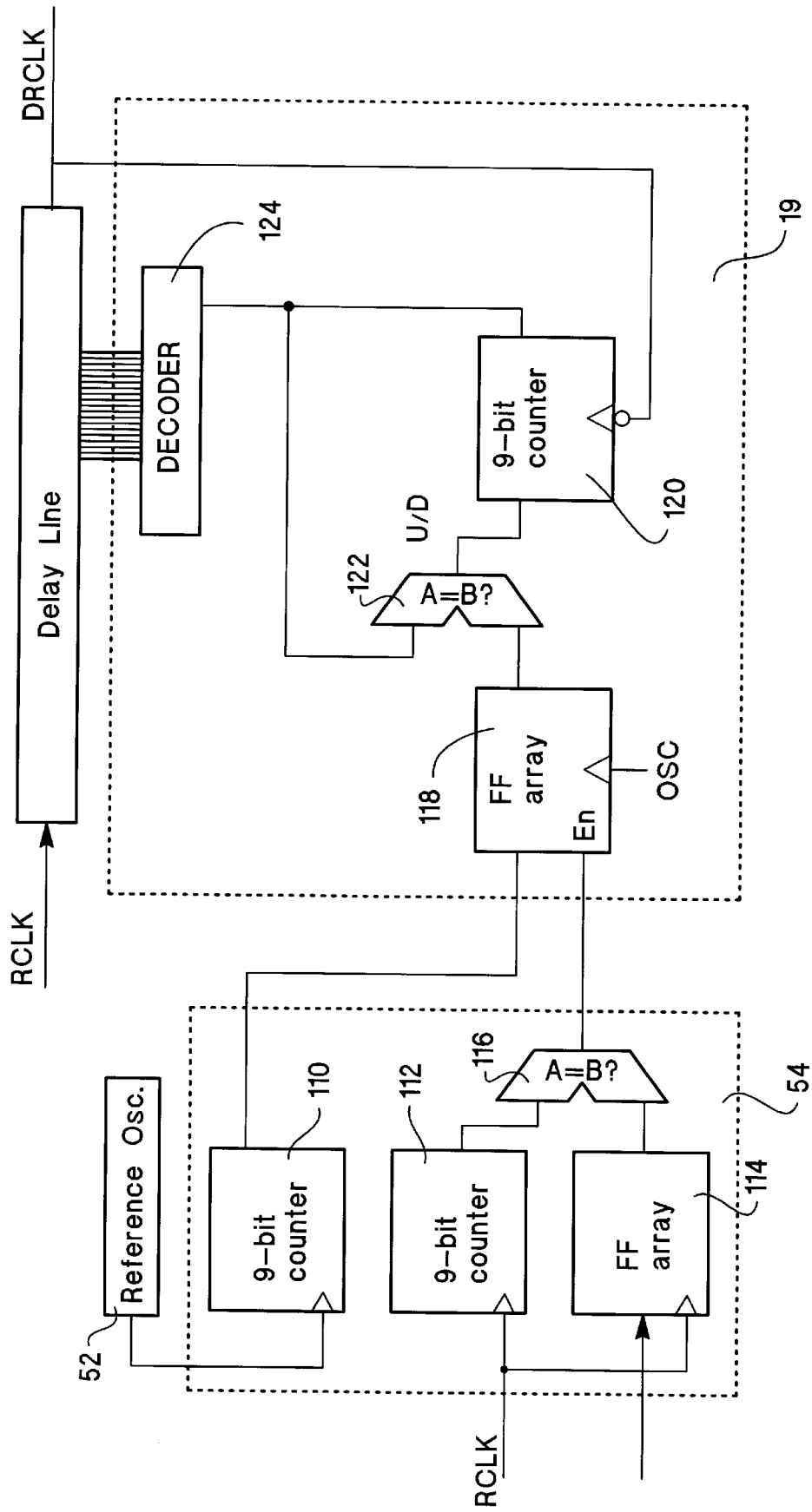
FIG. 7 shows greater detail of the logic circuitry included within the calibration logic circuitry of FIG. 5.

FIG. 7 shows greater detail of the logic circuitry included within the calibration logic circuitry 54 of FIG. 5. The calibration logic circuitry 54 includes a reference counter 110, a clock counter 112 and a delay flip flop array 114. The reference counter 110 receives and counts the cycles of the signal generated by the reference oscillator 52. The clock counter receives and counts the cycles of the clock signal RCLK. The delay flip flop array 114 latches a digital value representing the desired absolute delay through the programmable delay line. Later discussion will describe how the value programmed into the delay flip flop array is derived.

The calibration logic circuitry 54 further includes a first comparator 116. The first cooperator 116 detects when the clock counter 112 has counted the same number of clock signal RCLK cycles as the number latched in the delay flip flop array 114. Once this condition has been detected by the first cooperator 116, a reference flip flop array 118 latches the count value of the reference counter 110. The period TREF of the reference oscillator 52 is always greater than the period TCLK of the reference clock signal RCLK to avoid overflow of the reference counter 110.

The counter value latched into the reference flip flop array 118 is used to program the main delay chain and the auxiliary delay chains. However, the digital control logic block 19 includes a second cooperator 122 and a calibration counter 120. The second cooperator 122 drives an up/down control of the calibration counter 120. The inputs to the second cooperator are the outputs of the calibration counter 120 and the reference flip flop array 118. The output of the calibration counter 120 is connected to a decoder 124 which controls the delay of the main delay chain and the delay of the auxiliary delay chains. The calibration counter 120 is clocked by the delayed clock signal DRCLK.

The second comparator 122 and the calibration counter 120 serve two purposes. First, they ensure that the programmable delay never changes by greater than one programmed increment or decrement between cycles of the delayed clock signal DRCLK. Secondly, because the calibration counter 120 is driven by the delayed clock signal DRCLK, the programming of the main delay chain and the auxiliary delay chains is synchronized with the delayed clock signal DRCLK.

If the delay TREF increases due to variations in the value of the delay T, the calibration counter 120 decrements the number of delay cells included within the programmable delay loop. If the period TREF decreases due to variation in the value of the delay T, the calibration counter 120 increments the number of delay cell included within the programmable delay loop. If the value latched into the reference flip flop array 118 exceeds or is less than the count value of the calibration counter 120, then the calibration counter 120 is decremented or incremented correspondingly.

An embodiment of the invention includes the least significant bits of the calibration counter 120 controlling which of the second cells of the auxiliary delay chains is selected to be included within the delay of the clock signal RCLK. For the embodiment of the invention shown in FIG. 1 and FIG. 2, the two least significant bits of the calibration counter 120 control the selection of the second cells of the auxiliary delay chains. In general, with k auxiliary delay chains, $\log_2 k$ least significant bits of the calibration counter 120 are used to control the programmed delay of the auxiliary delay chains and the remaining bits control the main delay chain. Further, the minimum delay through the programmable delay line is $(k+2)*T$.

Figure 8:
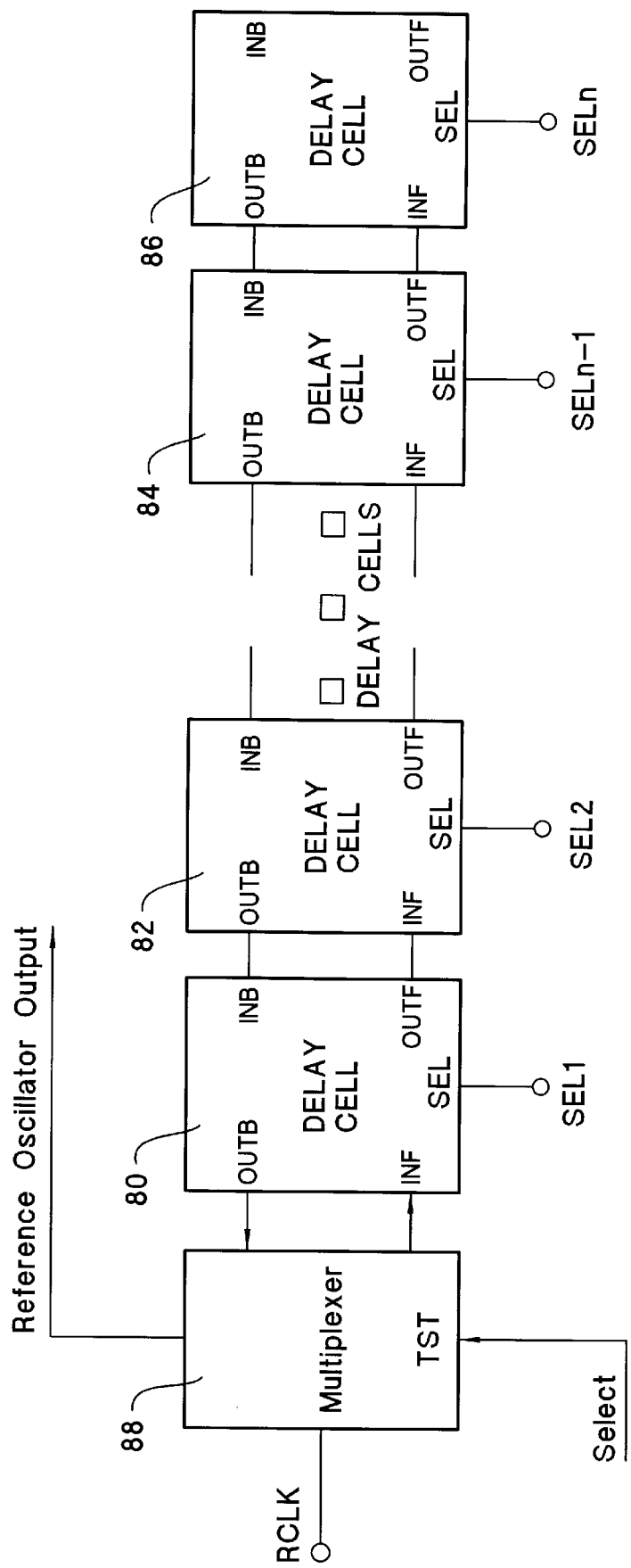
FIG. 8 shows greater detail of the logic circuitry included within the reference oscillator of FIG. 6 and FIG. 7.
Figure 5:
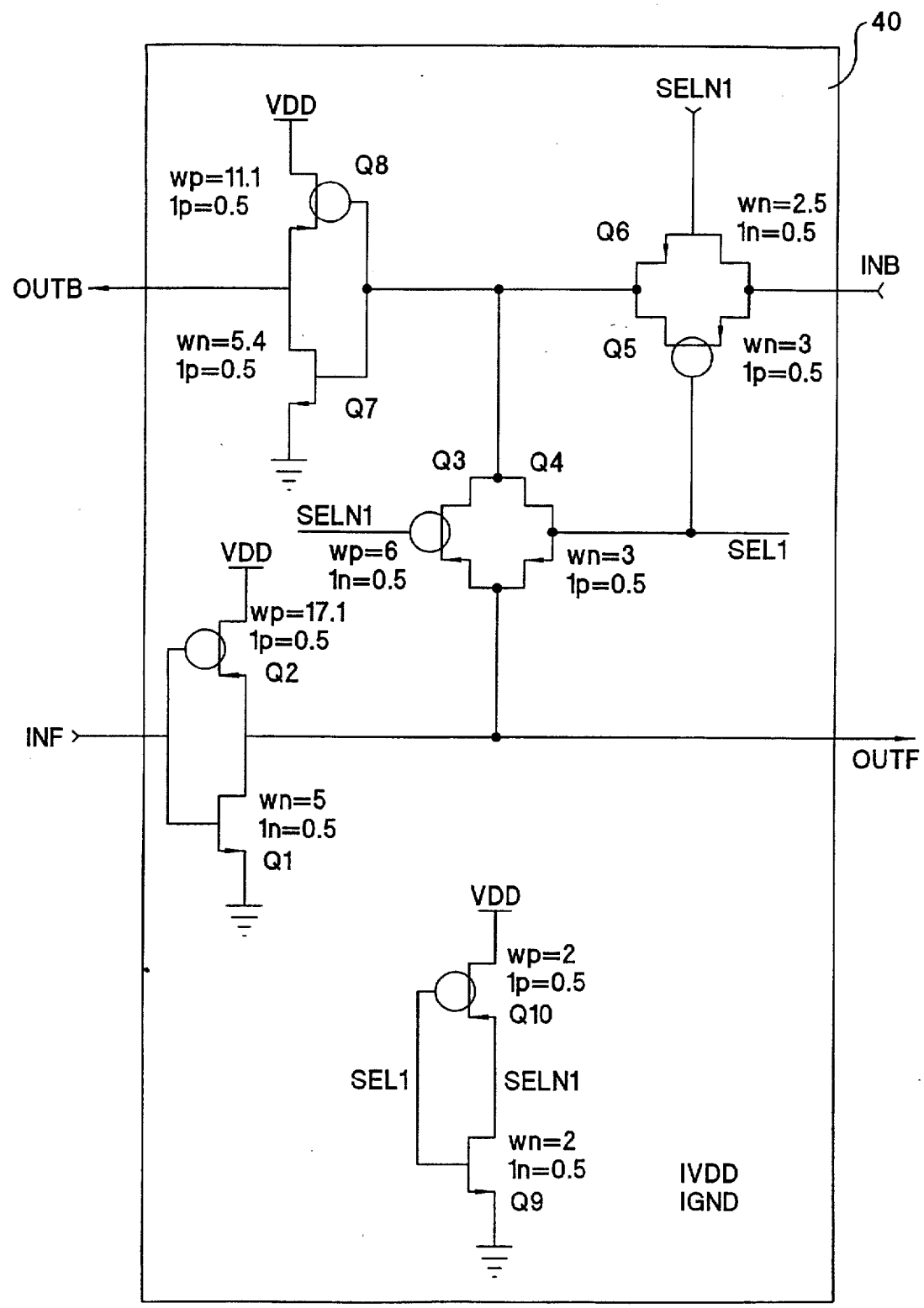

FIG. 8 shows an embodiment of the logic circuitry included within the reference oscillator 52 of FIG. 6 and FIG. 7. This embodiment, commonly referred to as a ring oscillator, includes several unit delay cells 80, 82, 84, 86. Ring oscillators are well known in the art of digital electronics. This embodiment of the reference oscillator 52 also includes a muliplexer 88. The multiplexer 88 allows the reference oscillator output to be coupled to either the reference oscillator or to the clock signal RCLK. A select line determines whether the reference oscillator or the clock signal RCLK is coupled to reference. This capability can be useful for delay line characterization and testing.

Generally, for a desired amount of delay through the programmable delay line, the value to be latched in the delay flip flop array 114 is equal to $(8*Tdelay/TCLK)*(R+(Tmux/T))$, where Tdelay is the desired absolute delay of the clock signal RCLK, TCLK is the period of the clock signal RCLK, R is the number of delay cells within the ring oscillator, Tmux is the delay through the multiplexer 88, and T is the delay of a unit delay cell.

For example, if the desired delay Tdelay of the programmable delay line is 5000 picoseconds, T=400 picoseconds, Tmux=700 picoseconds, TRCLK=8000 picoseconds and R=30, then the value to be latched into the delay flip flop array 114 is $(8*5000/8000)*(30+(700/400))=158.75$. This value can be rounded up to 159.

Although specific embodiments of the invention have been described and illustrated, the invention is not to be limited to the specific forms or arrangements of parts so described and illustrated. The invention is limited only by the claims.

What is claimed is:

1. A programmable delay line comprising:
   a main delay line chain, the main delay chain comprising a plurality of delay cells, each delay cell having a unit delay of T, the main delay chain programmable to connect an integer number of the delay cells in series;
   a plurality of N auxiliary delay chains, each auxiliary delay chain comprising a plurality of delay cells, each auxiliary delay chain programmable to connect the delay cells within each auxiliary delay chain in series, a first delay cell within each auxiliary delay chain having a delay of T, a second delay cell within the Xth auxiliary delay chain having a delay of $(1+X/N)*T$, where X varies from 0 to (N-1);
   the plurality of N auxiliary delay chains connected in series with the main delay chain and receiving a clock signal having a period TCLK; wherein
   the clock signal is coupled through the main delay chain and the plurality of N auxiliary delay chains and is programmably delayed with a resolution of (T)/N.

2. The programmable delay line as recited in claim 1, further comprising:
   a reference oscillator generating a reference signal having a period TREF which is a multiple of T; and
   means for comparing the period TREF of the reference signal and the period TCLK and programming the main delay chain and the auxiliary delay chain to compensate for deviations between TREF and TCLK.

3. The programmable delay line as recited in claim 2, wherein the means for comparing the period of TREF with TCLK comprises:
   a reference counter receiving the reference oscillator signal, the reference counter having a reference digital output which increments by a count of one with each cycle of the reference oscillator signal;
   a clock counter receiving the clock signal, the clock counter having a clock digital output which increments by a count of one with each cycle of the clock signal;
   a first latching array receiving a digital delay value and latching the digital delay value to a digital first latch output;
   a first comparator receiving the clock digital output and the digital fist latch output and generating an active level output when the clock digital output is equal to the digital first latch output; and
   a reference latching array for latching the reference digital output when the first comparator generates an active level output.

4. The programmable delay line as recited in claim 3, wherein the reference latching array controls the programming of the main delay chain and the auxiliary delay chains.

5. The programmable delay line as recited in claim 3, wherein the means for comparing the period of TREF with TCLK further comprises:
   a calibration counter which counts cycles of the delayed clock signal and generates a digital calibration output; and
   a second comparator which receives a digital output from the reference latching array and the digital calibration output, the second comparator controlling when the calibration counter counts up and when the calibration counter counts down.

6. The programmable delay line as recited in claim 4, wherein the calibration counter controls the programming of the main delay chain and the auxiliary delay chains.

7. The programmable delay line as recited in claim 2, wherein the reference oscillator is a ring oscillator comprising a plurality of delay cells.

8. The programmable delay line as recited in claim 2, wherein each delay cell comprises two programmable states and the delay through each delay cell is the same for both programmable states.

* * * * *

UNITED STATES PATENT AND TRADEMARK OFFICE
CERTIFICATE OF CORRECTION

PATENT NO. : 5,900,762
DATED : May 4, 1999
INVENTOR(S) : Vinodkumar Ramakrishnan It is certified that error appears in the above-identified patent and that said Letters Patent is hereby corrected as shown below:

Formal Drawings, Page 4 of 7, Figure 5, "Q2" arrow should be --pointing to the left--; (Page 4 of Formal Drawing attached);

Formal Drawings, Page 4 of 7, Figure 5, "Q10" arrow should be --pointing to the left--; (Page 4 of Formal Drawing attached);

Column 1, line 38, "fabrication" shoud read --fabricate--;

Column 1, line 42, "in-tolerant" should read --intolerant--;

Column 2, line 3, "line chain" should read --chain line--;

Column 6, line 20, "cooperator" should read --comparator--;

UNITED STATES PATENT AND TRADEMARK OFFICE
CERTIFICATE OF CORRECTION

PATENT NO. : 5,900,762
DATED : May 4, 1999
INVENTOR(S) : Vinodkumar Ramakrishnan It is certified that error appears in the above-identified patent and that said Letters Patent is hereby corrected as shown below:

Column 6, line 24, "cooperator" should read --comparator--;

Column 6, line 32, "cooperator" should read --comparator--;

Column 6, line 33, "cooperator" should read --comparator--;

Column 6, line 35, "cooperator" should read --comparator--;

Column 8, line 25, "fist" should read --first--.

Signed and Sealed this

Twentieth Day of June, 2000

Q. TODD DICKINSON

Attest:

Attesting Officer

Director of Patents and Trademarks